US012629913B2

(12) United States Patent
Son et al.

(10) Patent No.: US 12,629,913 B2
(45) Date of Patent: May 19, 2026

(54) TUBE, PUMP INCLUDING THE SAME, AND CHEMICAL SOLUTION SUPPLY APPARATUS

(71) Applicant: SEMES CO., LTD., Cheonan-si (KR)

(72) Inventors: Youngjun Son, Cheonan-si (KR); Sunghun Eom, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 267 days.

(21) Appl. No.: 18/129,075

(22) Filed: Mar. 31, 2023

(65) Prior Publication Data

US 2023/0347617 A1    Nov. 2, 2023

(30) Foreign Application Priority Data

Apr. 1, 2022    (KR) ........................ 10-2022-0041223

(51) Int. Cl.
| | |
|---|---|
| *B32B 1/08* | (2006.01) |
| *B32B 3/08* | (2006.01) |
| *B32B 9/00* | (2006.01) |
| *B32B 9/04* | (2006.01) |
| *B32B 15/02* | (2006.01) |

(Continued)

(52) U.S. Cl.
CPC .................. *B32B 1/08* (2013.01); *B32B 3/08* (2013.01); *B32B 9/007* (2013.01); *B32B 9/041* (2013.01); *B32B 9/043* (2013.01); *B32B 15/02* (2013.01); *B32B 15/085* (2013.01); *B32B 27/322* (2013.01); *F16L 11/127* (2013.01); *H01L 21/67017* (2013.01); *H10N 10/13* (2023.02); *B32B 9/04* (2013.01); *B32B 2307/20* (2013.01); *B32B 2307/202* (2013.01); *B32B 2307/714* (2013.01); *B32B 2597/00* (2013.01)

(58) Field of Classification Search
CPC .. B32B 1/08; B32B 3/08; B32B 9/007; B32B 9/041; B32B 9/043; B32B 15/02; B32B 15/085; B32B 27/322; B32B 9/04; B32B 2307/20; B32B 2307/202; B32B 2307/714; B32B 2597/00; B32B 9/045; B32B 2262/103; B32B 7/025; B32B 15/08; F16L 11/127; F16L 11/04; F16L 9/14; F16L 58/10; F17D 1/14; F17D 3/01; F17D 5/00
See application file for complete search history.

(56) References Cited

U.S. PATENT DOCUMENTS

| | | | |
|---|---|---|---|
| 6,446,673 B1 * | 9/2002 | Iio | B32B 1/08 |
| | | | 138/140 |
| 8,714,203 B2 * | 5/2014 | Theis | B32B 25/10 |
| | | | 138/124 |

(Continued)

FOREIGN PATENT DOCUMENTS

| | | |
|---|---|---|
| JP | 2012-226927 | 11/2012 |
| KR | 10-1346919 | 12/2013 |

(Continued)

OTHER PUBLICATIONS

Office Action of the Korean Intellectual Property Office dated Mar. 23, 2024.

*Primary Examiner* — Vishal Pancholi

(57) ABSTRACT

A tube includes an outer layer including a first material having flexibility, an inner layer including a second material having flexibility and chemical resistance, and an intermediate layer arranged between the outer layer and the inner layer and including an electrically conductive material.

9 Claims, 5 Drawing Sheets

(51) Int. Cl.
    *B32B 15/085*        (2006.01)
    *B32B 27/32*         (2006.01)
    *F16L 11/127*       (2006.01)
    *H01L 21/67*        (2006.01)
    *H10N 10/13*        (2023.01)

(56) References Cited

U.S. PATENT DOCUMENTS

| | | | |
|---|---|---|---|
| 9,759,353 | B2 * | 9/2017 | Manas-Zloczower .......................... B32B 27/22 |
| 10,400,760 | B2 | 9/2019 | Sasa et al. |
| 11,772,369 | B2 * | 10/2023 | Caviezel ................. B32B 27/08 138/137 |
| 2005/0067035 | A1 * | 3/2005 | Suzuki .................... F16L 11/04 138/140 |
| 2007/0148389 | A1 * | 6/2007 | Nishioka ............ F02M 37/0017 428/36.91 |
| 2007/0231523 | A1 | 10/2007 | Ohmi et al. |
| 2007/0259147 | A1 * | 11/2007 | Boudry ..................... B32B 1/08 428/36.8 |
| 2009/0314375 | A1 * | 12/2009 | Flat .......................... B32B 1/08 138/137 |
| 2010/0059132 | A1 * | 3/2010 | Jannson ................. F16L 57/06 138/104 |
| 2021/0107734 | A1 | 4/2021 | Yano et al. |

FOREIGN PATENT DOCUMENTS

| | | |
|---|---|---|
| KR | 10-2016-0047996 | 5/2016 |
| KR | 10-2016-0047997 | 5/2016 |
| KR | 10-2019-0091276 | 8/2019 |

* cited by examiner

TUBE, PUMP INCLUDING THE SAME, AND CHEMICAL SOLUTION SUPPLY APPARATUS

CROSS-REFERENCE TO RELATED APPLICATION

This application is based on and claims priority under 35 U.S.C. § 119 to Korean Patent Application No. 10-2022-0041223, filed on Apr. 1, 2022, in the Korean Intellectual Property Office, the disclosure of which is incorporated by reference herein in its entirety.

BACKGROUND

1. Field

The disclosure relates to a tube, a pump including the same, and a chemical solution supply apparatus. More particularly, the disclosure relates to a tube, a pump including the same, and a chemical solution supply apparatus capable of detecting a state change of a component by measuring a current change according to the state change.

2. Description of the Related Art

In a semiconductor manufacturing process, a chemical solution supply apparatus is used to supply a chemical solution such as a photoresist composition to a wafer or the like. In this case, various types of pumps are used in the chemical solution supply apparatus to discharge a chemical solution to a wafer or the like. Among the various types of pumps, a tube pump discharges a chemical solution while repeatedly contracting and expanding a flexible and elastic tube by using a pressurizing unit. However, the state of the tube may be changed in the process of repeatedly contracting and expanding the tube, and thus, the discharge amount of the chemical solution through the tube pump may not be uniform. Accordingly, when the amount of the chemical solution supplied to the wafer or the like is not uniform, the functional reliability of a semiconductor manufactured by using the chemical solution may be degraded.

SUMMARY

Provided is measuring a current change of an intermediate layer included in a tube and detecting a change degree of a tube state through the measurement to maintain a uniform amount of a chemical solution supplied from the tube to a wafer and secure the functional reliability of a semiconductor manufactured by using the chemical solution.

Provided is blocking foreign substances such as particles that may be introduced into a chemical solution from outside a tube through an intermediate layer included in the tube to improve the quality of the chemical solution and secure the functional reliability of a semiconductor manufactured by using the chemical solution.

Additional aspects will be set forth in part in the description which follows and, in part, will be apparent from the description, or may be learned by practice of the presented embodiments of the disclosure.

According to an aspect of the disclosure, a tube includes an outer layer including a first material having flexibility, an inner layer including a second material having flexibility and chemical resistance, and an intermediate layer arranged between the outer layer and the inner layer and including an electrically conductive material.

In an embodiment, each of the first material and the second material may include at least one of perfluoroalkoxy alkane (PFA), polytetrafluoroethylene (PTFE), fluorinated ethylene propylene (FEP), and ethylene tetra fluoro ethylene (ETFE).

In an embodiment, the first material and the second material may be same as each other.

In an embodiment, the intermediate layer may include at least one of a carbon-based conductive material and a metal nanostructure.

In an embodiment, the carbon-based conductive material may include at least one of graphene, graphene oxide, and a carbon nanotube.

In an embodiment, the metal nanostructure may include a metallic nanowire including at least one of gold, silver, and platinum.

In an embodiment, the intermediate layer may include a plurality of layers and each of the plurality of layers may include an electrically conductive material.

In an embodiment, the tube may further include an n-type semiconductor, a p-type semiconductor, and a first conductive layer, wherein the n-type semiconductor and the p-type semiconductor may be spaced apart from each other and arranged over the intermediate layer and the first conductive layer may be arranged over the n-type semiconductor and the p-type semiconductor.

In an embodiment, the first conductive layer may include at least one of a carbon-based conductive material and a metal nanostructure.

In an embodiment, the first conductive layer may include a same material as the intermediate layer.

According to another aspect of the disclosure, a pump includes a tube, a pump case accommodating the tube and including a gas chamber outside the tube, and a supplier/discharger configured to supply or discharge air to the gas chamber, wherein the tube includes an outer layer, an inner layer, and an intermediate layer arranged between the outer layer and the inner layer and including an electrically conductive material, and each of the outer layer and the inner layer includes at least one of perfluoroalkoxy alkane (PFA), polytetrafluoroethylene (PTFE), fluorinated ethylene propylene (FEP), and ethylene tetra fluoro ethylene (ETFE).

In an embodiment, the pump may further include an ammeter configured to measure a current flowing through the intermediate layer.

In an embodiment, the pump may further include a ground electrode connected to the intermediate layer.

In an embodiment, the pump may further include a power supply configured to apply power to the intermediate layer.

According to another aspect of the disclosure, a chemical solution supply apparatus includes a chemical solution supplier, a pump configured to receive a chemical solution from the chemical solution supplier and discharge the chemical solution, a transfer line configured to transfer the chemical solution from the chemical solution supplier to the pump, and a discharge line configured to discharge the chemical solution from the pump, wherein the pump includes a tube, a pump case accommodating the tube and including a gas chamber outside the tube, an ammeter, and a supplier/discharger configured to supply or discharge air to the gas chamber, the tube includes an outer layer, an inner layer, and an intermediate layer arranged between the outer layer and the inner layer and including an electrically conductive material, and each of the outer layer and the inner layer includes at least one of perfluoroalkoxy alkane (PFA), polytetrafluoroethylene (PTFE), fluorinated ethylene propylene (FEP), and ethylene tetra fluoro ethylene (ETFE).

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
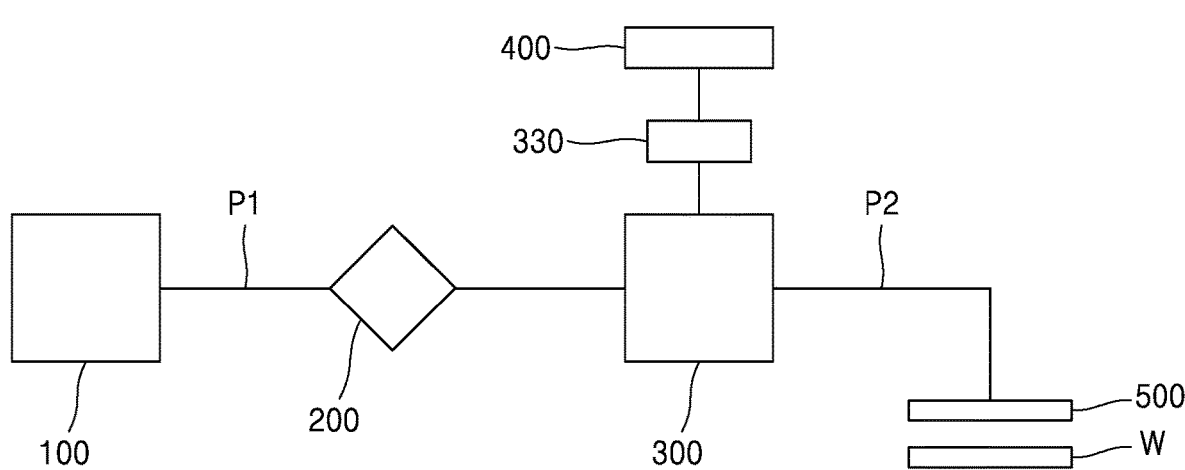
FIG. 1 is a block diagram illustrating a chemical solution supply apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments will be described in detail with reference to the accompanying drawings. Herein, like reference numerals will denote like elements, and redundant descriptions thereof will be omitted for conciseness.

FIG. 1 is a block diagram illustrating a chemical solution supply apparatus 1000 according to an embodiment.

Referring to FIG. 1, the chemical solution supply apparatus 1000 may include a chemical solution supplier 100, a filter 200, a pump 300, a controller 400, and a nozzle 500.

The chemical solution supplier 100 may accommodate a chemical solution. The chemical solution supplier 100 may be, for example, a closed type but is not limited thereto. In an embodiment, the chemical solution supplier 100 may have a tube structure. That is, the chemical solution supplier 100 may have a tube structure capable of flowing the chemical solution from one side to the other side such that the chemical solution supplied from one side may be discharged to the other side.

Although not illustrated in FIG. 1, the chemical solution supplier 100 may be connected to a gas supply source (not illustrated) capable of supplying an inert gas such as a nitrogen gas into the chemical solution supplier 100. The gas supply source may supply the inert gas into the chemical solution supplier 100. As the supply of the inert gas by the gas supply source is controlled, the discharge of the chemical solution from the chemical solution supplier 100 may also be controlled. For example, when the inert gas is supplied into the chemical solution supplier 100 to pressurize a chemical solution in the chemical solution supplier 100, the chemical solution may be discharged from the chemical solution supplier 100 to the pump 300 through a transfer line P1. A valve (not illustrated) may be arranged between the gas supply source and the chemical solution supplier 100. The valve may be opened/closed by an electric signal or a pneumatic pressure. According to the opening/ closing of the valve, the supply of the inert gas to the chemical solution supplier 100 may be controlled. In an embodiment, when oxidation of the chemical solution by air does not occur according to the type of the chemical solution, the gas supply source may supply compressed air into the chemical solution supplier 100.

In an embodiment, the chemical solution supplier 100 may further include a structure (not illustrated) in which a plurality of holes are formed. In this case, the structure may be a plate structure but is not limited thereto. The plurality of holes may be distributed over the entire area of the structure. For example, the plurality of holes may be spaced apart from each other at certain intervals and distributed over the entire area of the structure. Because the structure includes a plurality of holes, a chemical solution may pass through the plurality of holes but bubbles having a greater size than the plurality of holes may not pass therethrough. Accordingly, because bubbles included in a chemical solution may be removed, the functional reliability of a semiconductor manufactured by using the chemical solution may be improved.

In an embodiment, the chemical solution supplier 100 may further include a power supply (not illustrated) capable of applying a voltage to the structure. In this case, the structure may include an electrically conductive material. The power supply may apply a voltage to the structure to collect bubbles having passed through the plurality of holes. Accordingly, the functional reliability of a semiconductor manufactured by using the chemical solution may be improved.

In an embodiment, the structure may include a plurality of structures. For example, the chemical solution supplier 100 may include a first structure (not illustrated) and a second structure (not illustrated), and a plurality of holes may be formed in each of the first structure and the second structure. In this case, the chemical solution supplier 100 may further include a first power supply (not illustrated) capable of applying a voltage to the first structure and a second power supply (not illustrated) capable of applying a voltage to the second structure. The first power supply may apply a voltage having a first polarity to the first structure and the second power supply may apply a voltage having a second polarity to the second structure to collect all of bubbles having the first polarity and bubbles having the second polarity. Accordingly, the functional reliability of a semiconductor manufactured by using the chemical solution may be improved. The first polarity may be, for example, a positive polarity and the second polarity may be, for example, a negative polarity; however, the disclosure is not limited thereto.

The chemical solution may be a chemical solution used in a semiconductor device manufacturing process. The chemical solution may be, for example, a photoresist composition but is not limited thereto.

The filter 200 may be arranged on the transfer line P1 and may be located between the chemical solution supplier 100 and the pump 300. The filter 200 may remove foreign substances such as particles included in the chemical solution supplied to the pump 300 through the transfer line P1. Accordingly, the quality of the chemical solution may be improved. The chemical solution processed by the filter 200 may be supplied to the pump 300 through the transfer line P1.

The transfer line P1 may have, for example, a tube structure. In this case, one side of the transfer line P1 may be connected to the tube structure of the chemical solution supplier 100. Also, the other side of the transfer line P1 may be connected to a tube structure of the pump 300.

Although not illustrated in FIG. 1, a valve (not illustrated) may be arranged on the transfer line P1. The valve may be opened/closed by an electrical signal or a pneumatic pressure but is not limited thereto. The valve may include a plurality of valves. For example, the valve may include two valves, wherein one valve may be located between the chemical solution supplier 100 and the filter 200 and the other valve may be located between the filter 200 and the pump 300. In this case, the one valve may be opened/closed by an electrical signal and the other valve may be opened/closed by a pneumatic pressure; however, the disclosure is not limited thereto. The supply of the chemical solution through the transfer line P1 may be controlled according to the opening/closing of the valve. An operation of the valve may be controlled by the controller 400. In this case, the valve may be configured to transmit/receive electrical signals to/from the controller 400.

Figure 2A:
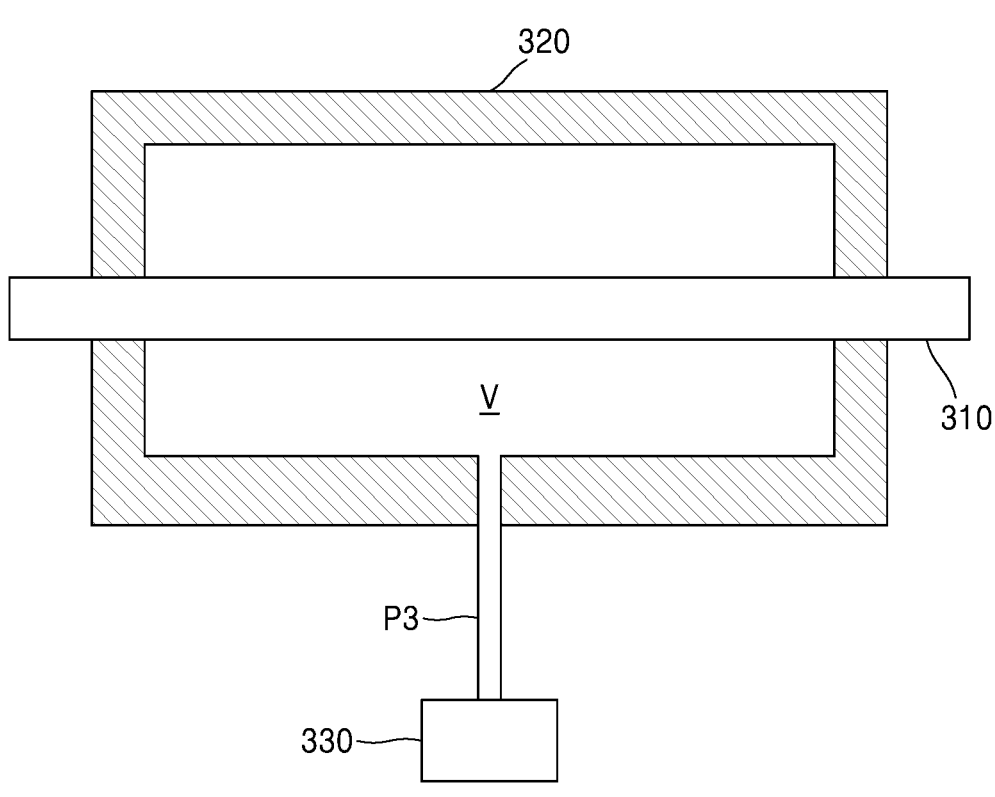
FIG. 2A is a cross-sectional view illustrating a pump according to an embodiment.
Figure 2B:
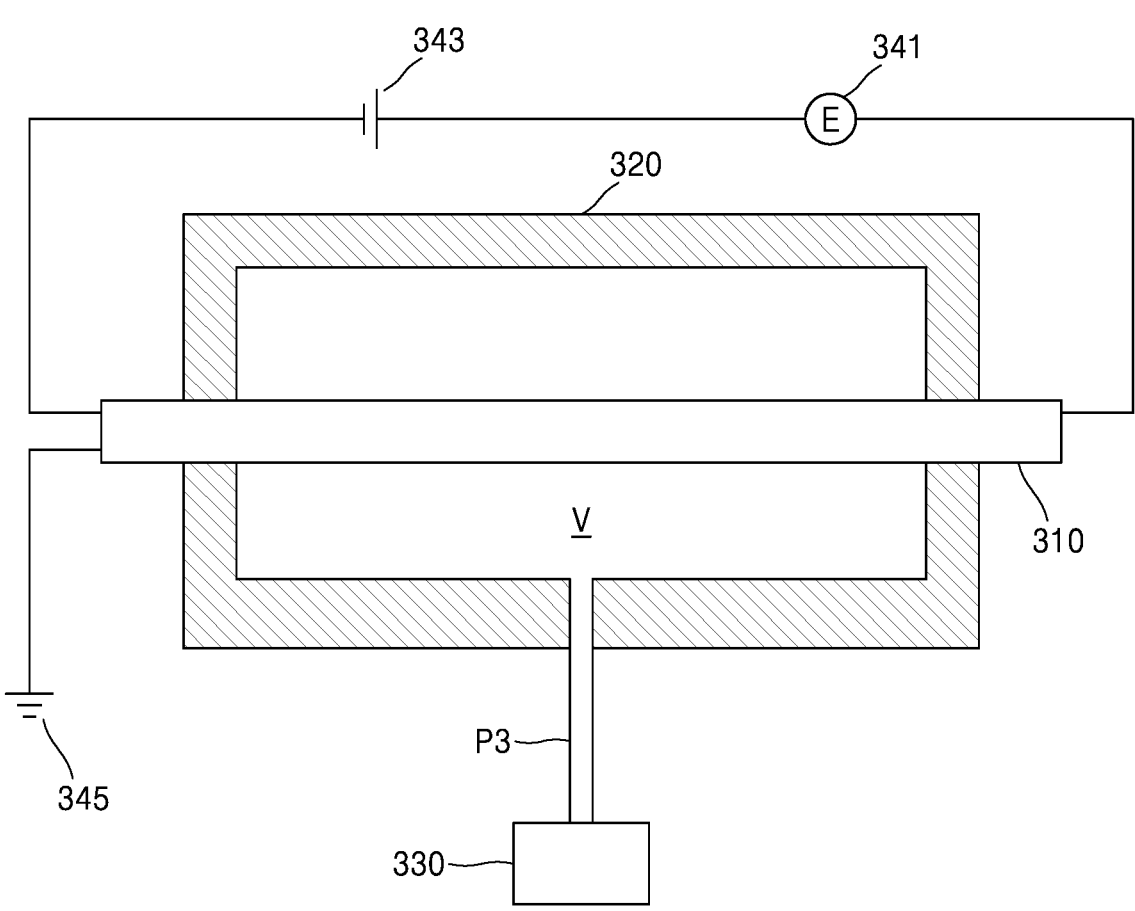
FIG. 2B is a cross-sectional view illustrating a pump according to an embodiment.

FIG. 2A is a cross-sectional view illustrating a pump 300 according to an embodiment. FIG. 2B is a cross-sectional view illustrating a pump 300 according to an embodiment.

Referring to FIGS. 1 and 2A, the pump 300 may include a tube 310, a pump case 320, and a supplier/discharger 330.

The chemical solution may be supplied to the tube 310 through the transfer line P1. The tube 310 may include a pump chamber D (see FIG. 3) that is an empty space therein, and the pump chamber D may accommodate the chemical solution for a certain time. As described below, the tube 310 may repeat contraction and expansion such that the chemical solution accommodated in the pump chamber D may be discharged to a discharge line P2 or the chemical solution may be supplied to the pump chamber D through the transfer line P1. The tube 310 may be assembled and fixed to the pump case 320. The tube 310 may have a cylindrical shape. A configuration of the tube 310 will be described below in detail with reference to FIGS. 3 and 4.

The pump case 320 may accommodate at least a portion of the tube 310. The pump case 320 may include a gas chamber V that is an empty space between the inner surface of the pump case 320 and the tube 310 accommodated in the pump case 320. As described below, air may be supplied to or discharged from the gas chamber V by the supplier/discharger 330. The pump case 320 may have a closed structure in which external substances may not be introduced into the pump case 320 from outside the pump case 320. The pump case 320 may include, for example, metal but is not limited thereto.

The supplier/discharger 330 may be connected to the gas chamber V through a supply/discharge line P3. The supplier/discharger 330 may supply air to the gas chamber V or discharge air from the gas chamber V. The pressure in the gas chamber V may be increased or decreased by the air supplied to or discharged from the gas chamber V. Accordingly, the tube 310 may be contracted or expanded such that the chemical solution in the tube 310 may be discharged or the chemical solution may be supplied into the tube 310. Particularly, when air is supplied to the gas chamber V from the supplier/discharger 330, the pressure in the gas chamber V may increase. Accordingly, the tube 310 may be contracted such that the chemical solution accommodated in the pump chamber D in the tube 310 may be discharged to the discharge line P2. On the other hand, when air is discharged from the gas chamber V to the supplier/discharger 330, the pressure in the gas chamber V may increase. Accordingly, the tube 310 may be expanded such that the chemical solution may be supplied to the pump chamber D in the tube 310 through the transfer line P1.

In an embodiment, the supplier/discharger 330 may make the gas chamber V into a vacuum state. Accordingly, gas molecules or the like adsorbed onto an intermediate layer 313 (see FIG. 3) may be desorbed from the intermediate layer 313 and the desorbed gas molecules may be removed.

An operation of the supplier/discharger 330 may be controlled by the controller 400. For example, the supplier/discharger 330 may be controlled by the controller 400 to supply air to the gas chamber V or discharge air from the gas chamber V. In this case, the supplier/discharger 330 may be configured to transmit/receive electrical signals to/from the controller 400.

Referring to FIG. 2B, in an embodiment, the pump 300 may further include an ammeter 341. The ammeter 341 may be connected to an intermediate layer 313 included in the tube 310 through an electric circuit and may measure a current flowing through the intermediate layer 313 including an electrically conductive material.

A state change of the tube 310 may occur while the tube 310 repeats contraction and expansion to supply the chemical solution. Particularly, when a state change of the tube 310 occurs in a state where air is supplied to the gas chamber V and thus the tube 310 is contracted, even when air is discharged from the gas chamber V, the tube 310 may not completely restore its original state. In this case, because the amount of the chemical solution that may be accommodated in the tube 310 decreases, the amount of the chemical solution supplied to the nozzle 500 through the following contraction process may decrease. Accordingly, because the amount of the chemical solution supplied to a wafer W through the nozzle 500 is not uniform, the functional reliability of a semiconductor manufactured by using the chemical solution may not be secured.

When a state change of the tube 310 occurs, the resistance of the intermediate layer 313 may change and thus a current flowing through the intermediate layer 313 may also change. For example, when a state change such as a distortion of the tube 310 occurs, the resistance of the intermediate layer 313 may increase and thus a current flowing through the intermediate layer 313 may decrease. The ammeter 341 may measure the current change to detect the state change of the tube 310. By detecting and managing the state change of the tube 310, the amount of the chemical solution supplied to the wafer W may be maintained uniform and the functional reliability of a semiconductor manufactured by using the chemical solution may be improved.

In an embodiment, the pump 300 may further include a power supply 343. The power supply 343 may be connected to the intermediate layer 313 through an electric circuit and may apply power to the intermediate layer 313. The intermediate layer 313 may be heated by applying power to the intermediate layer 313 by the power supply 343, and accordingly, the gas molecules adsorbed onto the intermediate layer 313 may be desorbed and removed from the intermediate layer 313.

In an embodiment, the pump 300 may further include a ground electrode 345. The ground electrode 345 may be connected to the intermediate layer 313. Accordingly, the electrification of the tube 310 may be prevented and accordingly the chemical solution accommodated in the pump chamber D in the tube 310 may be prevented from being electrified.

In an embodiment, the pump 300 may further include an internal filter (not illustrated). The internal filter may remove foreign substances such as particles included in the chemical solution supplied to the pump 300. Accordingly, the quality of the chemical solution may be improved.

Referring back to FIG. 1, the controller 400 may control an operation of the supplier/discharger 330. For example, the controller 400 may be configured to transmit/receive electrical signals to/from the supplier/discharger 330 to control an operation of the supplier/discharger 330.

The controller 400 may be implemented as hardware, firmware, software, or any combination thereof. For example, the controller 400 may be a computing device such as a workstation computer, a desktop computer, a laptop computer, or a tablet computer. For example, the controller 400 may include a memory device such as a read only memory (ROM) or a random access memory (RAM), and a processor configured to perform certain operations and algorithms, such as a microprocessor, a central processing unit (CPU), or a graphics processing unit (GPU). Also, the controller 400 may include a receiver and a transmitter for receiving and transmitting electrical signals.

The chemical solution may be supplied from the pump 300 to the nozzle 500 through the discharge line P2. The supplied chemical solution may be supplied onto the wafer W through the nozzle 500. The nozzle 500 may be located over the wafer W and may include a discharge port (not illustrated) for supplying the chemical solution onto the wafer W. The discharge port may have various forms, for example, such as a discharge port having a slit shape, a plurality of discharge ports spaced apart from each other at certain intervals, or a single discharge port.

Although not illustrated in FIG. 1, a valve (not illustrated) may be arranged on the discharge line P2. The valve may be opened/closed by an electrical signal or a pneumatic pressure but is not limited thereto. The valve may include a plurality of valves. For example, the valve may include two valves. The supply of the chemical solution through the discharge line P2 may be controlled by the opening/closing of the valve. An operation of the valve may be controlled by the controller 400. In this case, the valve may be configured to transmit/receive electrical signals to/from the controller 400.

Figure 3:
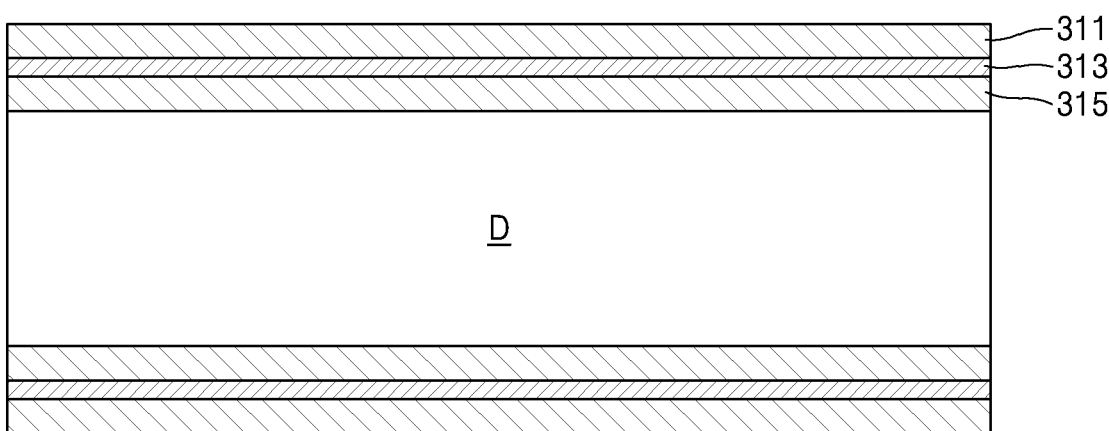
FIG. 3 is a cross-sectional view illustrating a tube according to an embodiment.

FIG. 3 is a cross-sectional view illustrating a tube 310 according to an embodiment.

Referring to FIG. 3, the tube 310 may include an outer layer 311, an inner layer 315, and an intermediate layer 313 arranged between the outer layer 311 and the inner layer 315.

The outer layer 311 may include a first material having flexibility and elasticity. In an embodiment, the first material may include at least one of perfluoroalkoxy alkane (PFA), polytetrafluoroethylene (PTFE), fluorinated ethylene propylene (FEP), and ethylene tetra fluoro ethylene (ETFE). One surface of the outer layer 311 may contact one surface of the intermediate layer 313, and the other surface of the outer layer 311 may contact the gas chamber V (see FIG. 2A).

The inner layer 315 may include a second material having flexibility, elasticity, and chemical resistance. In an embodiment, the second material may include at least one of perfluoroalkoxy alkane, polytetrafluoroethylene, fluorinated ethylene propylene, and ethylene tetra fluoro ethylene. One surface of the inner layer 315 may contact the other surface of the intermediate layer 313, and the other surface of the inner layer 315 may contact the pump chamber D.

Because the first material included in the outer layer 311 and the second material included in the inner layer 315 have flexibility and elasticity, the tube 310 including the same may contract or expand according to the pressure change of the gas chamber V (see FIG. 2A). Accordingly, the chemical solution accommodated in the pump chamber D may be discharged or the chemical solution may be supplied into the pump chamber D. Also, because the second material has chemical resistance, the corrosion of the inner layer 315 may be prevented even when the chemical solution is accommodated in the pump chamber D for a certain time.

In an embodiment, the first material and the second material may be the same material. For example, both the first material and the second material may be perfluoroalkoxy alkane.

The intermediate layer 313 may include an electrically conductive material. In an embodiment, the electrically conductive material may include at least one of a carbon-based conductive material and a metal nanostructure. The carbon-based conductive material may include, for example, graphene, graphene oxide, or a carbon nanotube but is not limited thereto. The metal nanostructure may include, for example, a metallic nanowire including at least one of gold, silver, and platinum but is not limited thereto.

Because the intermediate layer 313 includes an electrically conductive material, when a state change of the tube 310 including the same occurs, the state change of the tube 310 may be detected by measuring the current change of the intermediate layer 313. Accordingly, because the state change of the tube 310 may be managed, the amount of the chemical solution discharged by the tube 310 may be maintained uniform. Also, because the intermediate layer 313 is arranged between the outer layer 311 and the inner layer 315, gas molecules or the like introduced from outside the tube 310 may be adsorbed onto the intermediate layer 313. Accordingly, the gas molecules or the like may be prevented from being introduced into the chemical solution, and thus, the quality of the chemical solution may be prevented from being degraded. Furthermore, the intermediate layer 313 may function as a sensor for the gas molecules or the like. Particularly, when the gas molecules or the like are adsorbed onto the intermediate layer 313, the resistance of the intermediate layer 313 may change and accordingly a current flowing through the intermediate layer 313 may also change. By measuring the current change, the presence of gas molecules introduced from the outside may be identified.

In an embodiment, the intermediate layer 313 may include a plurality of layers, and each of the plurality of layers may include an electrically conductive material. In an embodiment, the electrically conductive material included in each of the plurality of layers may include at least one of a carbon-based conductive material and a metal nanostructure. The carbon-based conductive material may include, for example, graphene, graphene oxide, or a carbon nanotube but is not limited thereto. The metal nanostructure may include, for example, a metallic nanowire including at least one of gold, silver, and platinum but is not limited thereto.

In an embodiment, the electrically conductive materials respectively included in the plurality of layers may be different from each other. For example, the plurality of layers may be two layers, an electrically conductive material included in one layer may be graphene, and an electrically conductive material included in the other layer may be graphene oxide.

Figure 4:
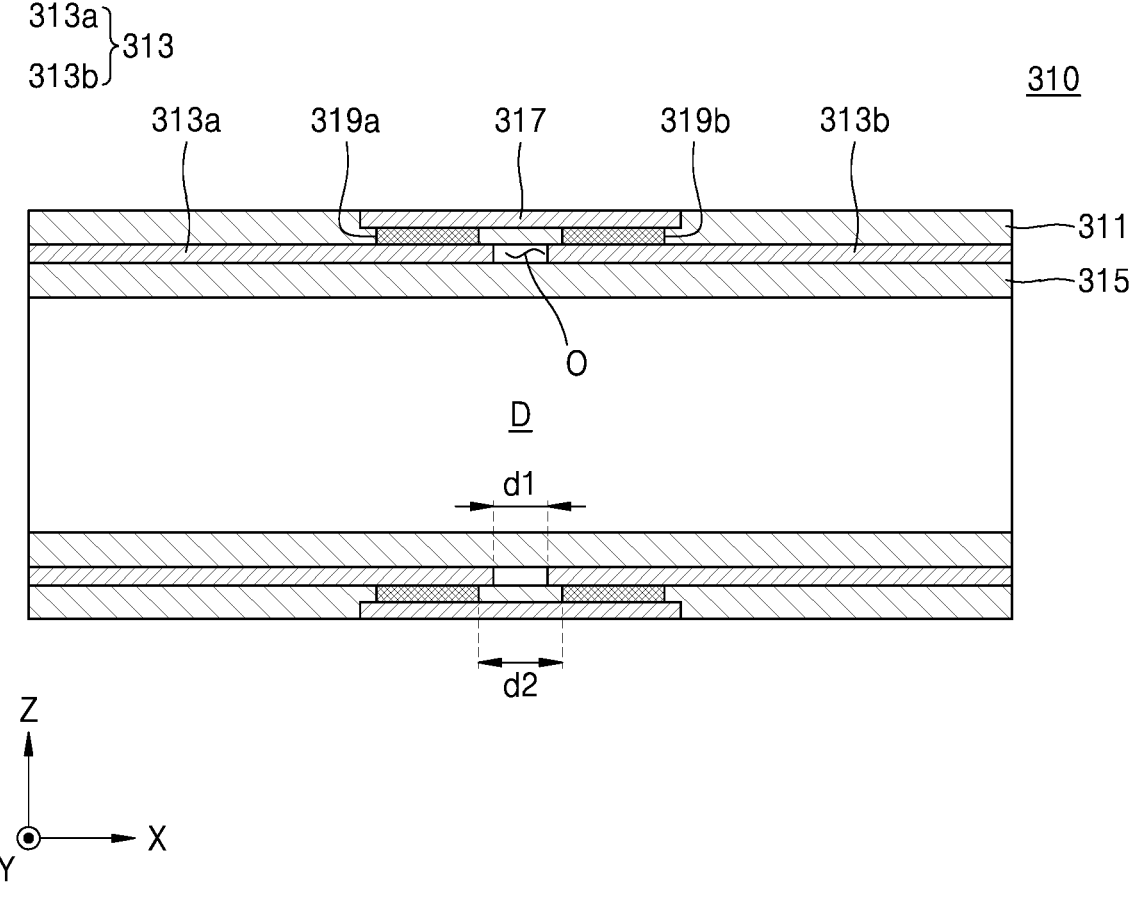
FIG. 4 is a cross-sectional view illustrating a tube according to an embodiment.

FIG. 4 is a cross-sectional view illustrating a tube 310 according to an embodiment. Because an outer layer 311, an inner layer 315, and an intermediate layer 313 illustrated in FIG. 4 are similar to the outer layer 311, the inner layer 315, and the intermediate layer 313 described with reference to FIG. 3, differences therebetween will be mainly described below.

Referring to FIG. 4, in an embodiment, the tube 310 may further include an n-type semiconductor 319*a*, a p-type semiconductor 319*b*, and a first conductive layer 317.

The n-type semiconductor 319*a* and the p-type semiconductor 319*b* may be arranged over the intermediate layer 313 to be spaced apart from each other, and the lower surfaces of the n-type semiconductor 319*a* and the p-type semiconductor 319*b* may contact a portion of the upper surface of the intermediate layer 313. Both side surfaces of the n-type semiconductor 319*a* and the p-type semiconductor 319*b* may be covered by the outer layer 311. The n-type semiconductor 319*a* and the p-type semiconductor 319*b* may include, for example, bismuth telluride ($Bi_2Te_3$) or lead telluride (PbTe). However, the disclosure is not limited thereto.

In an embodiment, the n-type semiconductor 319*a* and the p-type semiconductor 319*b* may respectively include a plurality of n-type semiconductors 319*a* and a plurality of p-type semiconductors 319*b*, and the plurality of n-type semiconductors 319*a* and the plurality of p-type semiconductors 319*b* may be respectively arranged over the intermediate layer 313 while being spaced from each other at certain intervals.

The first conductive layer 317 may be arranged over the n-type semiconductor 319*a* and the p-type semiconductor 319*b*. The upper surface of the first conductive layer 317 may be exposed to the gas chamber V (see FIG. 2). Both side surfaces of the first conductive layer 317 may be covered by the outer layer 311. Some area of the lower surface of the first conductive layer 317 may contact the upper surface of the n-type semiconductor 319*a* and the upper surface of the p-type semiconductor 319*b*, and the other area of the lower surface of the first conductive layer 317 may be covered by the outer layer 311.

In an embodiment, the first conductive layer 317 may include at least one of a carbon-based conductive material and a metal nanostructure. The carbon-based conductive material may include, for example, graphene, graphene oxide, or a carbon nanotube but is not limited thereto. The metal nanostructure may include, for example, a metallic nanowire including at least one of gold, silver, and platinum but is not limited thereto.

In an embodiment, the first conductive layer 317 may include the same material as the intermediate layer 313. For example, both the first conductive layer 317 and the intermediate layer 313 may include graphene.

The intermediate layer 313 may be divided into a first intermediate layer 313*a* and a second intermediate layer 313*b* by a spacer O. For example, between an area where the n-type semiconductor 319*a* is arranged and an area where the p-type semiconductor 319*b* is arranged, the intermediate layer 313 may be divided into a first intermediate layer 313*a* and a second intermediate layer 313*b* by a spacer O having an X-direction length d1 less than an X-direction spacing distance d2 between the n-type semiconductor 319*a* and the p-type semiconductor 319*b*. In this case, the Z-direction dimension of the spacer O may be equal to the Z-direction dimension of the intermediate layer 313. In this case, the n-type semiconductor 319*a* may be arranged over the first intermediate layer 313*a*, and the p-type semiconductor 319*b* may be arranged over the second intermediate layer 313*b*.

Although not illustrated in FIG. 4, a power supply (not illustrated) capable of applying power may be connected to each of the first intermediate layer 313*a* and the second intermediate layer 313*b*.

When the power supply flows a direct current, the intermediate layer 313, the n-type semiconductor 319*a*, the p-type semiconductor 319*b*, and the first conductive layer 317 may collectively function as a Peltier device.

The Peltier device may be a type of thermoelectric device using a Peltier effect that causes the transfer of heat, and the Peltier effect may refer to a phenomenon in which, when a current is supplied to two different materials, heat transfers to one side and heat escapes from the other side.

Referring back to FIG. 4, when a current is supplied by the power supply to the n-type semiconductor 319*a* and the p-type semiconductor 319*b* in a direction from the p-type semiconductor 319*b* toward the n-type semiconductor 319*a*, electrons in the n-type semiconductor 319*a* may transfer heat of the inner layer 315 and the pump chamber D to the outer layer 311 through the intermediate layer 313 and holes in the p-type semiconductor 319*b* may transfer heat of the inner layer 315 and the pump chamber D to the outer layer 311 through the intermediate layer 313. That is, heat of the inner layer 315 and the pump chamber D may be absorbed through the intermediate layer 313 and the absorbed heat may be discharged to the outer layer 311 and thus the temperature of the inner layer 315 and the pump chamber D may decrease. On the other hand, when a current is supplied by the power supply to the n-type semiconductor 319*a* and the p-type semiconductor 319*b* in a direction from the n-type semiconductor 319*a* toward the p-type semiconductor 319*b*, electrons in the n-type semiconductor 319*a* may transfer heat of the outer layer 311 to the intermediate layer 313 and holes in the p-type semiconductor 319*b* may transfer heat of the outer layer 311 to the intermediate layer 313. That is, heat of the outer layer 311 may be discharged through the intermediate layer 313 and thus the temperature of the inner layer 315 and the pump chamber D may increase.

While the tube 310 supplies the chemical solution, heat may be generated according to repeated contraction and expansion of the tube 310. In this case, by supplying a current in a direction from the p-type semiconductor 319*b* toward the n-type semiconductor 319*a*, the heat may be discharged through the outer layer 311 and thus the temperature of the tube 310 may be reduced.

Also, when temperature adjustment is required according to the type of the chemical solution, the temperature of the tube 310 may be adjusted to a temperature suitable for the chemical solution by supplying a current in a direction from the p-type semiconductor 319*b* toward the n-type semiconductor 319*a* or supplying a current in a direction from the n-type semiconductor 319*a* toward the p-type semiconductor 319*b*. Accordingly, the quality of the chemical solution supplied through the tube 310 may be improved.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A tube comprising:

an outer layer comprising a first material having flexibility;

an inner layer comprising a second material having flexibility and chemical resistance; and an intermediate layer arranged between the outer layer and the inner layer and comprising an electrically conductive material, wherein the first material and the second material are the same as each other.

2. The tube of claim 1, wherein each of the first material and the second material comprises at least one of perfluoroalkoxy alkane (PFA), polytetrafluoroethylene (PTFE), fluorinated ethylene propylene (FEP), and ethylene tetrafluoroethylene (ETFE).

3. The tube of claim 1, wherein the intermediate layer comprises at least one of a carbon-based conductive material and a metal nanostructure.

4. The tube of claim 3, wherein the carbon-based conductive material comprises at least one of graphene, graphene oxide, and a carbon nanotube.

5. The tube of claim 3, wherein the metal nanostructure comprises a metallic nanowire comprising at least one of gold, silver, and platinum.

6. The tube of claim 1, wherein the intermediate layer comprises a plurality of layers and each of the plurality of layers comprises an electrically conductive material.

7. The tube of claim 1, further comprising an n-type semiconductor, a p-type semiconductor, and a first conductive layer, wherein the n-type semiconductor and the p-type semiconductor are spaced apart from each other and arranged over the intermediate layer and the first conductive layer is arranged over the n-type semiconductor and the p-type semiconductor.

8. The tube of claim 7, wherein the first conductive layer comprises at least one of a carbon-based conductive material and a metal nanostructure.

9. The tube of claim 7, wherein the first conductive layer comprises a same material as the intermediate layer.

* * * * *